(12) United States Patent
Mallecot et al.

(10) Patent No.: US 6,521,471 B1
(45) Date of Patent: Feb. 18, 2003

(54) MULTI-SECTION OPTO-ELECTRONIC COMPONENT

(75) Inventors: Franck Mallecot, Montrouge (FR); Christine Chaumont, Villejuif (FR); Arnaud Leroy, Paris XIVème (FR); Antonina Plais, Paris XIXème (FR)

(73) Assignee: ALCATEL, Paris (FR)

( * ) Notice: Subject to any disclaimer, the term of this patent is extended or adjusted under 35 U.S.C. 154(b) by 338 days.

(21) Appl. No.: 09/650,737

(22) Filed: Aug. 30, 2000

(30) Foreign Application Priority Data

Aug. 31, 1999 (FR) .............................. 99 10957

(51) Int. Cl.[7] .......................... H01L 21/00; H01L 31/12
(52) U.S. Cl. ............................ 438/24; 438/23; 257/80; 257/82
(58) Field of Search .................... 438/23, 24, 28; 257/80, 81, 82, 83, 84

(56) References Cited

U.S. PATENT DOCUMENTS

| | | | |
|---|---|---|---|
| 5,031,188 A | | 7/1991 | Koch et al. |
| 5,362,673 A | * | 11/1994 | Iechi .......................... 438/24 |
| 5,436,195 A | * | 7/1995 | Kimura et al. ................ 438/24 |
| 5,652,812 A | * | 7/1997 | Gurib et al. .................. 385/14 |
| 5,674,778 A | * | 10/1997 | Lee et al. ..................... 438/24 |
| 5,808,314 A | * | 9/1998 | Nakajima et al. ............. 257/84 |
| 5,848,088 A | * | 12/1998 | Mori et al. .................... 438/24 |
| 5,978,401 A | * | 11/1999 | Morgan ........................ 438/24 |
| 6,015,719 A | * | 1/2000 | Kish et al. .................... 257/84 |
| 6,229,189 B1 | * | 5/2001 | Yap et al. ..................... 257/80 |

FOREIGN PATENT DOCUMENTS

| | | |
|---|---|---|
| EP | 0 847 113 A1 | 6/1998 |
| JP | 58 196 085 A | 11/1983 |

OTHER PUBLICATIONS

Liou K–Y et al,: "Monolithically Integrated Semiconductor Led–Amplifier for Applications as Transceivers In Fiber Access Systems" IEEE Photonics Technology Letters, US,IEEE Inc., New York, vol. 8, No. 6, Jun. 1, 1996, pp. 800–802, XP000590018, ISSN: 1041–1135.

* cited by examiner

*Primary Examiner*—Kevin M. Picardat
(74) *Attorney, Agent, or Firm*—Sughrue Mion, PLLC

(57) ABSTRACT

The invention concerns a semiconductor opto-electronic component comprising at least two optically active structures (20, 30), at least one of which consists of a detector (30), characterized in that the detector or detectors (30) comprise a first active portion (33) able to detect a signal at a given wavelength and a second inactive portion (34) only slightly sensitive to the signal to be detected and exposed to the non-guided stray light conveyed in the component.

13 Claims, 4 Drawing Sheets

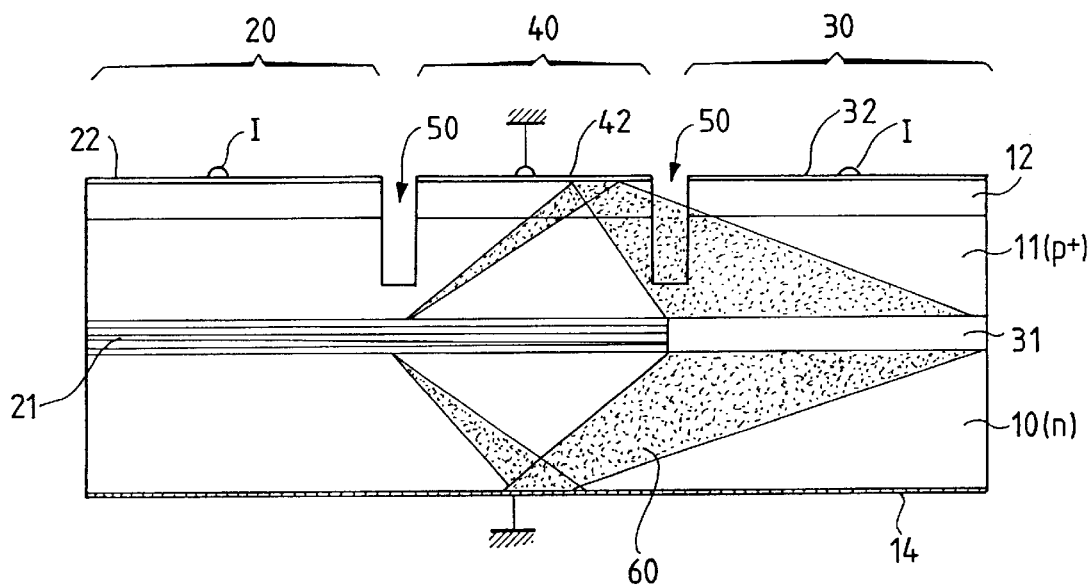
FIG_1
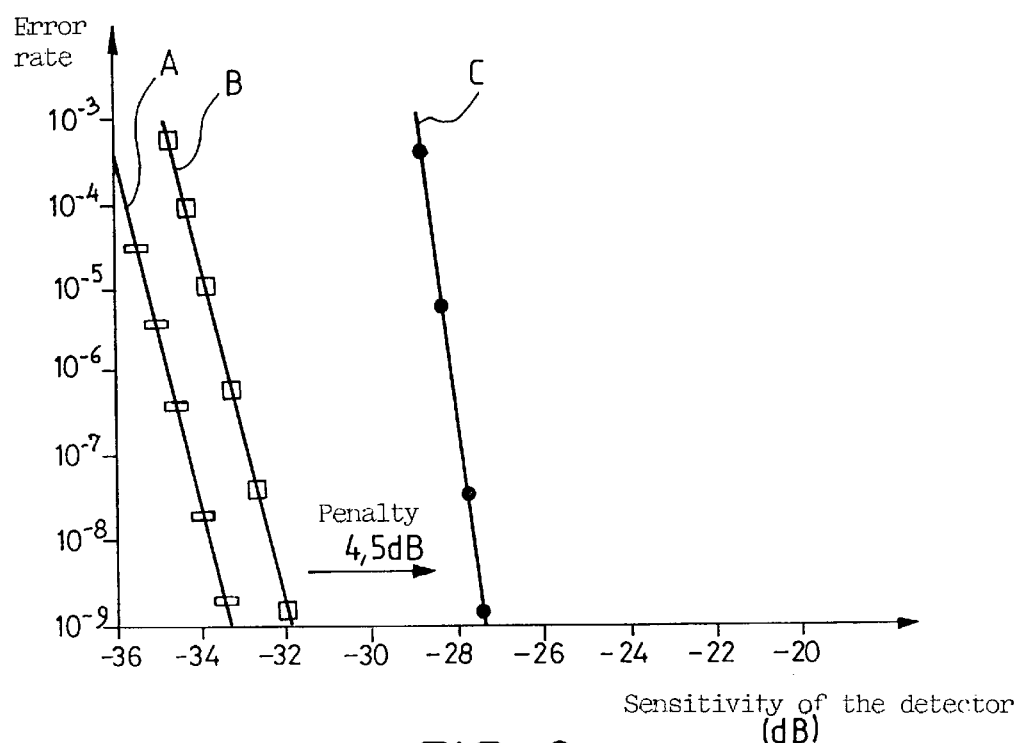
FIG_2

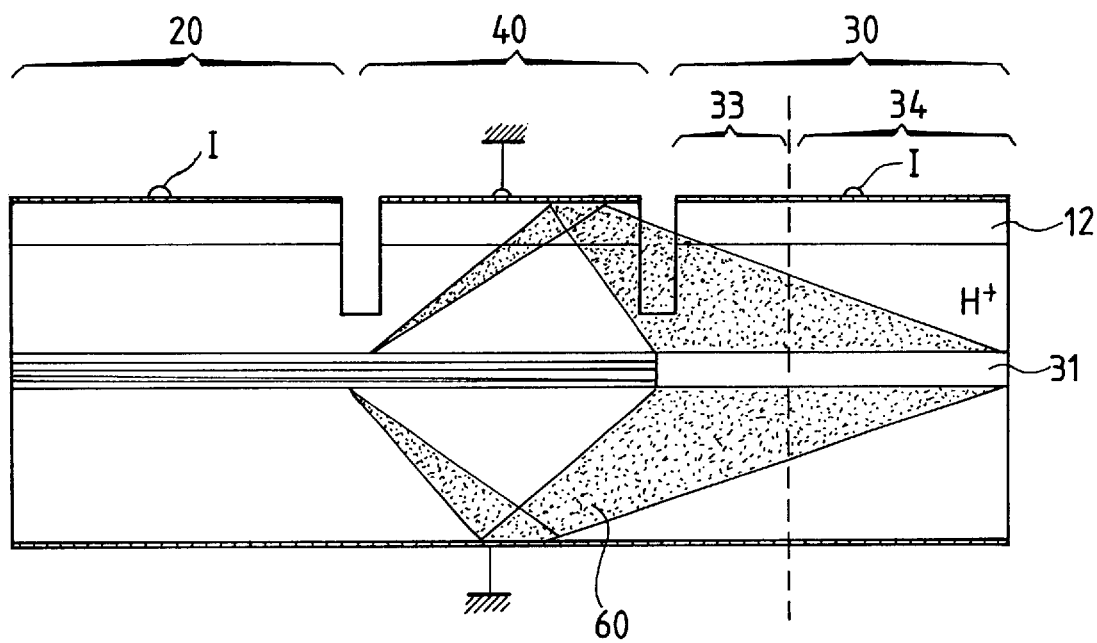
FIG_3
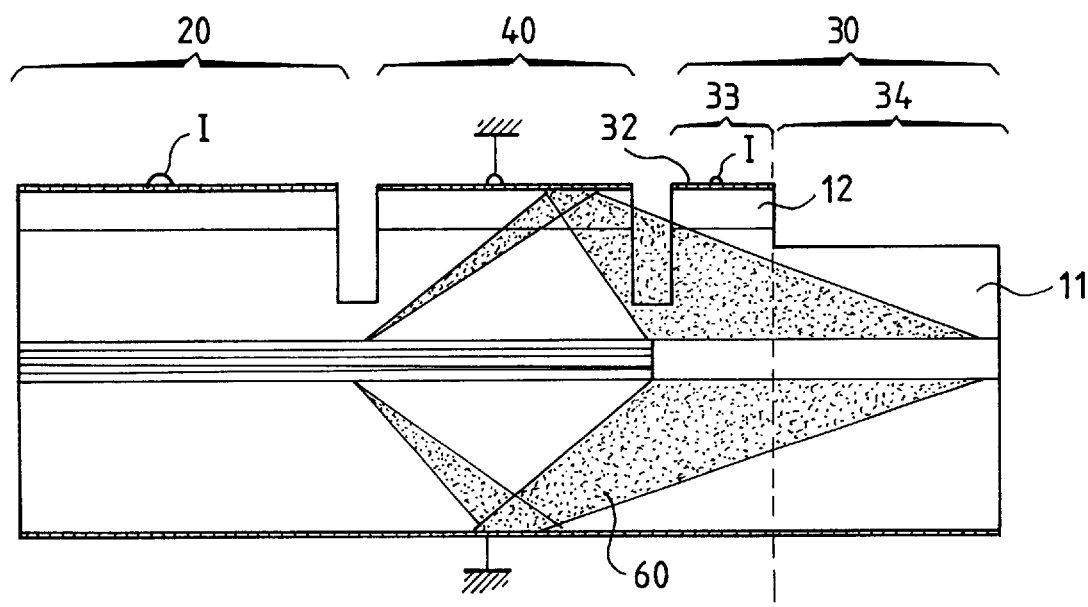
FIG_4

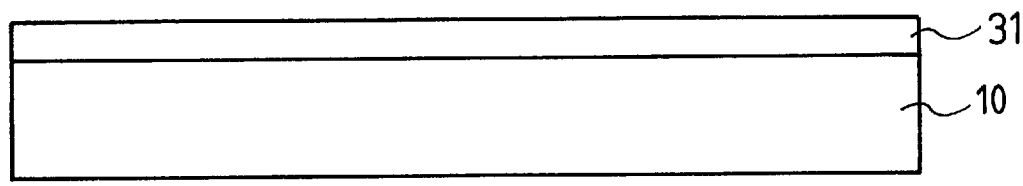
FIG_5a
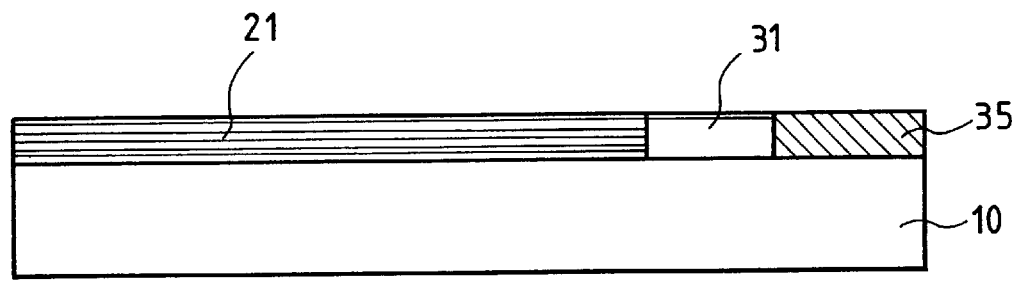
FIG_5b
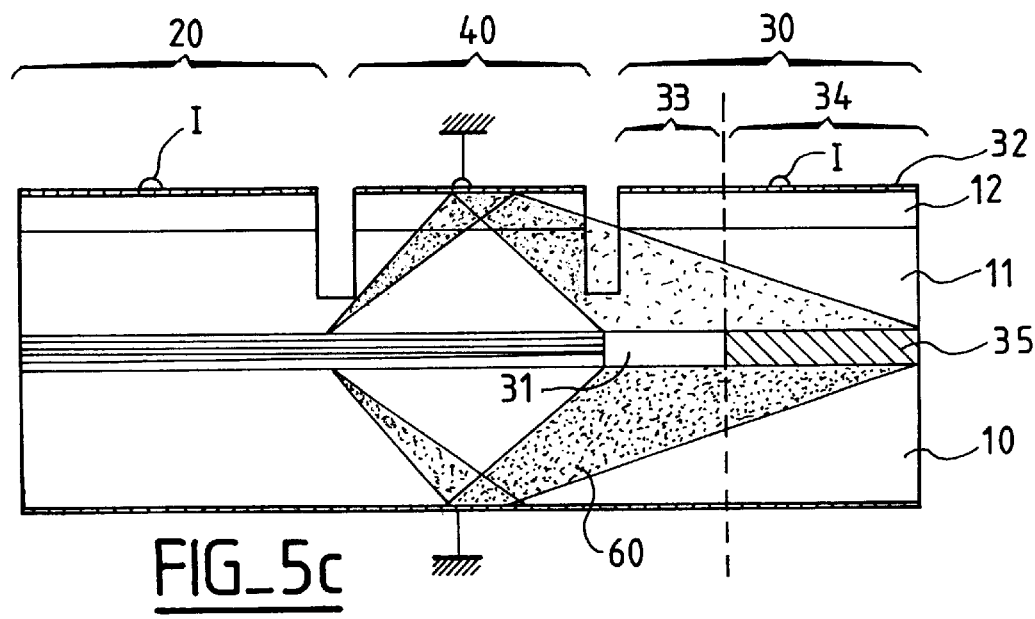
FIG_5c

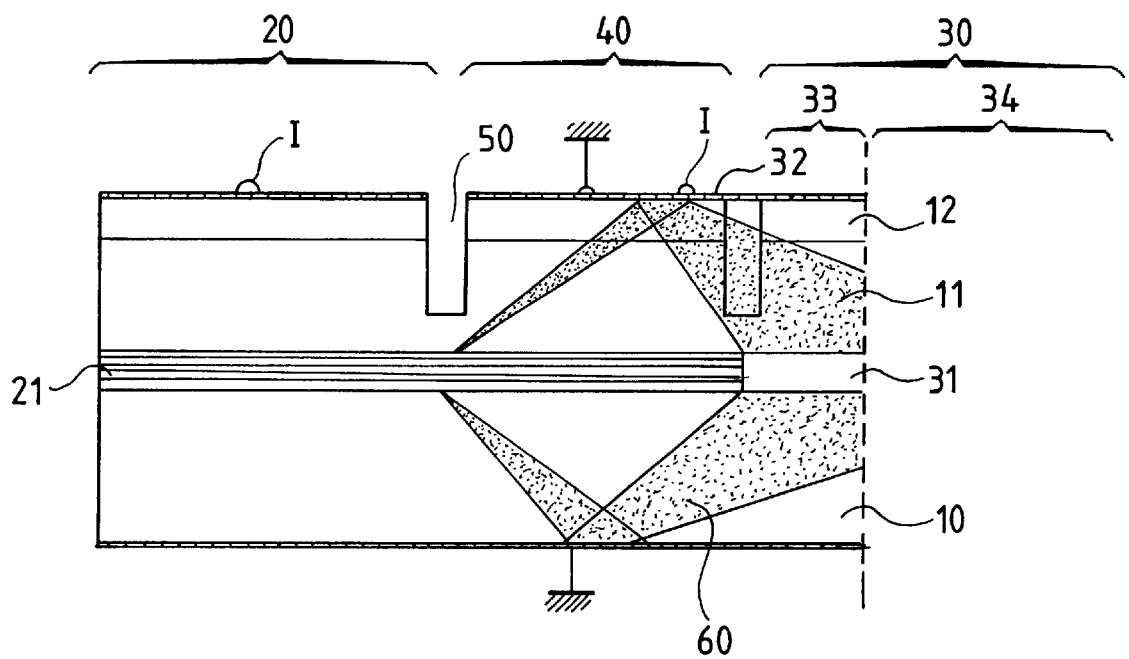
FIG_6a
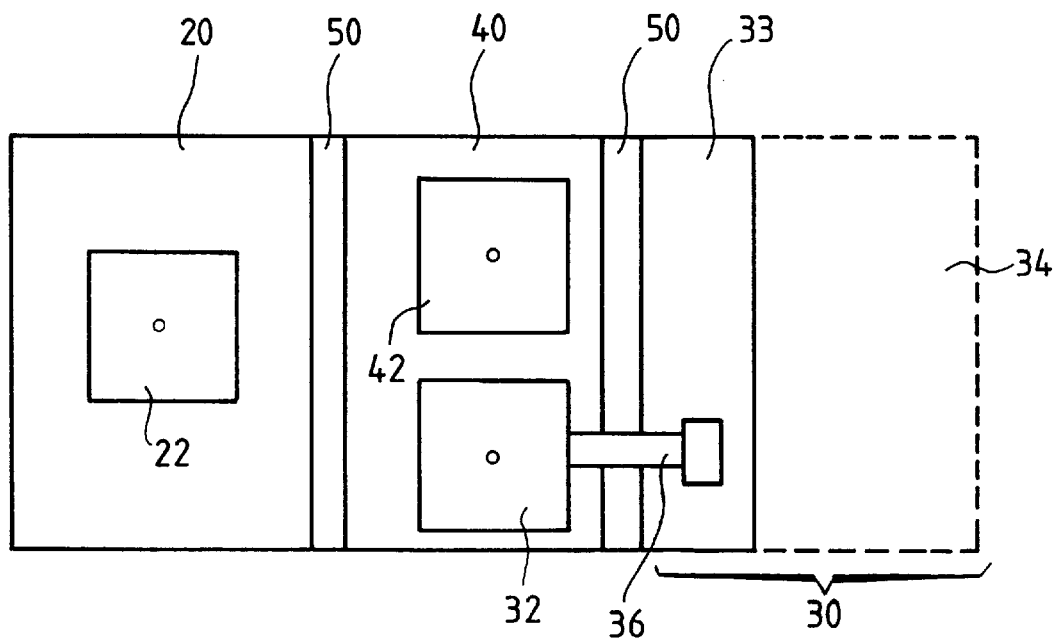
FIG_6b

MULTI-SECTION OPTO-ELECTRONIC COMPONENT

BACKGROUND OF THE INVENTION

The present invention relates to a semiconductor opto-electronic component comprising at least two optically active sections each having a waveguide buried in a cladding layer.

For this type of multi-section opto-electronic component, it is important to have high electrical insulation between each section in order to prevent interactions between these during the functioning of the component. The invention relates more particularly to any opto-electronic component comprising at least one receiving element integrated with another element.

The objective of the present invention is to permit simultaneous functioning of the optically active structures without any interaction between the transmitter and receiver and/or between the different receivers detecting signals at different wavelengths.

FIG. 1 depicts a diagram in longitudinal section of a conventional in-line transceiver component, denoted 1D-TRD ("In-line Transmitter Receiver Device" in British and American literature), obtained by the monolithic integration of a laser 20 and detector 30 on the same substrate 10. The laser 20 sends a signal towards an optical fibre, for example, whilst the detector 30 receives a signal coming from this same optical fibre. The emission wavelength of the laser 20 is less than the reception wavelength of the detector 30. For example, the emission wavelength is equal to 1.3 µm whilst the reception wavelength is 1.55 µm. In this case, given that the emission wavelength is less than the reception wavelength, and that the laser 20 is situated close to the detector 30, the laser can cause optical interference on the detector. This is because the laser also emits, in the direction of the detector, light at 1.3 µm which dazzles the latter.

To prevent this dazzling of the detector, the component has a third section, disposed between the laser 20 and detector 30, forming an optical isolator 40. This optical isolator absorbs the light emitted at 1.3 µm in the direction of the detector, so that the latter can detect the 1.55 µm optical signal coming from the optical fibre without being disturbed by the laser.

The substrate 10, or bottom layer, can for example be n-doped InP. The waveguides, respectively 31 of the detector 30 and 21 of the laser 20 and of the optical isolator 40, are etched in the form of ribbons and buried in a highly doped cladding layer 11. The waveguides are said to be of the BRS ("Buried Ridge Structure" in British and American literature) type. The cladding material 11 is p+ doped when the substrate is n doped. Naturally, this type of ribbon is only one example. Other types of ribbon can be suitable. The n and p dopings of the different layers can also be reversed.

The composition and dimensions of the waveguides are of little importance. In the example in FIG. 1, the waveguide 31 of the detector 30 is for example produced from ternary material, whilst the waveguide 21 of the laser 20 and of the optical isolator 40 is produced in a structure with quantal wells.

In addition, metallic electrodes 22, 32, 42 and 14 are formed on the different sections and on the bottom of the component, so as to enable it to function.

An absorbent layer 12 doped with the same type of carrier as the cladding layer 11 is situated between the conductive layer 11 and the metallic electrodes 22, 32, 42 so as to afford good electrical contact and in order to collect the carriers which make it possible to detect the signal on the electrode 32 of the detector 30. This absorbent layer 12 can consist of a ternary material, for example.

Because of the presence of conductive layers 11, the component also has electrical isolation areas 50, or resistivity areas, between the different sections 20, 30, 40 in order to prevent any electrical disturbance of one section vis-à-vis another during the functioning of the component.

This type of in-line transceiver, having a central part 40 for absorbing all the light flux sent at 1.3 µm to the detector, functions very well for all the light which is guided in the waveguide ribbons 21.

However, not all the light emitted is entirely guided. This is because there exists also spontaneous light which is emitted throughout the volume of the component. In addition, some of the stimulated light can also be diffracted in the component because of the presence of defects in the waveguide 21.

The curves in FIG. 2 show the penalties noted on the sensitivity of the detector, in dB, for different operating modes. Curve A represents a reception reference when the laser is off, curve B represents a reception reference when the laser is on continuously and curve C represents the simultaneous functioning of the laser and detector. A penalty of 4.5 dB is found between curve B and curve C, when the laser and detector are modulated simultaneously. This penalty is also increased by increasing the power of the laser.

This penalty is principally optical. It is caused by the non-guided light emitted at 1.3 µm, in all directions, which interferes with the detector at 1.55 µm.

This optical disturbance is depicted highly diagrammatically in FIG. 1 by the wave 60. The metallic electrode 14, disposed at the substrate/air interface, can play the role of an optical reflector in the substrate 10. Some of the spontaneous light emitted in the volume of the component can therefore be reflected by the electrode 14 and be coupled with the waveguide 31 of the detector 30 from below. Likewise, some of the stray light 60 can also be reflected on the electrodes 42 and 32 since the absorbent layer 12 does not absorb all this stray light 60.

Naturally, the disturbance of the detector 30 by the non-guided light 60 is in reality much more complex than a simple reflection. This is because some of the stray light can also undergo multiple reflections in the bottom layer 10 and top layer 11. Another part of this stray light can also dazzle the detector in glancing incidence, for example.

Techniques have already been envisaged for combating the penalty of 4.5 dB found in the example given in FIG. 2, which occurs during the simultaneous functioning of the laser and detector. The techniques envisaged are essentially electronic techniques.

These techniques consist, for example, of taking part of the laser modulation signal, and then subtracting it in reception. The use of these electronic processing techniques has demonstrated a reduction of 2 dB in the penalty. However, they require the development, manufacture and adjustment of specific electronics for this type of particular transceiver component, so that they considerably increase the cost of this component. However, it is being sought to manufacture this type of component on a large scale and therefore to reduce its cost price to the maximum possible extent. Consequently these electronic processing techniques can not be used for the mass production of such a component.

In addition, an in-line transceiver is intended to be installed at subscribers and must be able to function between 0 and 70° C. without any temperature regulation. However, the reliability of these electronic techniques has not been demonstrated over this range of temperatures and it is not proved that they can automatically adjust themselves according to the temperature.

SUMMARY OF THE INVENTION

One aim of the present invention therefore consists of producing an inexpensive opto-electronic component including a detector and a parasitic element for this detector, such as a laser or any other element, the operating wavelength of the parasitic element being less than the reception wavelength of the detector, and in which the interference of 4.5 dB on the detector by the parasitic element (according to the example in FIG. 2), which occurs during their simultaneous operation, is considerably reduced.

To this end, the invention proposes to reduce the active proportion of the detector able to detect a signal, whilst the stray light illuminates the entire detector.

The invention concerns more particularly a method of manufacturing a semiconductor opto-electronic component comprising at least two optically active structures, at least one of which consists of a detector, characterised in that it comprises a step consisting of limiting the length of the active portion of the detector or detectors able to detect a signal at a given wavelength, the non-guided stray light conveyed in the component being distributed over the entire detector.

According to a first embodiment, the limitation of the active portion of the detector or detectors is achieved by implanting protons on the remaining portion of the detector.

According to a second embodiment, the limitation of the active portion of the detector or detectors is achieved by locating the detector contact on this portion.

According to a third embodiment, the limitation of the active portion of the detector or detectors is achieved by etching the remaining portion, and growing a passive layer on the latter.

According to a fourth embodiment, the detector is cleaved so as to limit its active portion.

The present invention also concerns the component obtained by such a method and more particularly a semiconductor opto-electronic component comprising at least two optically active structures, at least one of which consists of a detector, the said active structures being separated by an intermediate section, characterised in that the detector or detectors comprise a first active portion able to detect a signal at a given wavelength and a second inactive portion weakly sensitive to the signal to be detected and exposed to the non-guided stray light conveyed in the component.

According to a first variant, the second portion of the detector or detectors is implanted with protons.

According to a second variant, the detector contact is located on the first portion.

According to a third variant, each portion has different epitaxial layers, the active layer of the second portion having been removed by etching and replaced by a passive layer.

The invention also concerns a semiconductor opto-electronic component comprising at least two optically active structures, at least one of which consists of a detector, the said active structures being separated by an intermediate section, characterised in that the detector is cleaved so as to limit it to the length of the active portion able to detect a signal at a given wavelength.

According to one characteristic, the reception wavelength of the detector is greater than the operating wavelength or wavelengths of the other parasitic structure or structures.

According to one application, the component according to the invention constitutes an in-line transceiver.

According to another application, the component according to the invention constitutes an array of receivers.

The method according to the invention makes it possible to obtain a multi-section opto-electronic component in which the interference on the detector caused by the other elements is considerably reduced.

In addition, the embodiments described do not require the development of new manufacturing methods, and can consequently be implemented easily and rapidly.

In addition, the limitation of the active part of the detector to its front part limits the electrical field on the cleaved rear facet of the component, which has the direct consequence of limiting the risks of damage to the component due to defects on the facet.

BRIEF DESCRIPTION OF THE DRAWINGS

Other particularities and advantages of the invention will emerge from a reading of the description given by way of illustrative example and made with reference to the accompanying figures, in which:

FIG. 1, already described, is a diagram of a conventional in-line transceiver,

FIG. 2, already described, illustrates curves for showing the operating penalties during a simultaneous modulation of the transmitter and receiver of the component of FIG. 1, FIG. 3 is a diagram of an optical component according to a first embodiment of the invention, FIG. 4 is a diagram of an optical component according to a second embodiment of the invention, FIGS. 5a to 5c illustrate schematically the steps of producing an optical component according to a third embodiment of the invention, FIG. 6a is a diagram of an optical component according to a fourth embodiment of the invention, FIG. 6b depicts a plan view of FIG. 6a.

DETAILED DESCRIPTION OF THE INVENTION

FIG. 3 shows diagrammatically a first embodiment of a component according to the invention. It shows diagrammatically more particularly an in-line transceiver. However, the invention is not solely limited to in-line transceivers. It can apply to any integrated opto-electronic component with which cross-talk exists, that is to say to any component comprising a parasitic element and an element suitable for detecting for which the wavelengths emitted and received are compatible.

For example, in the case of an array of detectors, the stray light comes from the optical fibre and is conveyed throughout the component.

In the example illustrated, a transceiver is considered. The same references are used to designate the same elements as in the conventional transceiver shown diagrammatically in FIG. 1. The laser 20 emits at a wavelength less than the reception wavelength of the detector 30. The emission wavelength is for example 1.3 μm whilst the reception wavelength is 1.55 μm.

The spontaneous light emitted by the laser 20 and not guided by the waveguide 21 is emitted throughout the volume of the component. In addition, some of the stimulated light is diffracted in the component because of the presence of defects in the waveguide 21. All these stray light waves emitted at 1.3 μm by the laser 20, in all directions, disturb and dazzle the detector 30, which can no longer correctly detect the wavelength at 1.55 μm.

These disturbances are shown diagrammatically simply by the wave 60 in FIG. 3. They come from above and below the waveguides 21, 31 of the transceiver component. These disturbances give rise to a penalty of 4.5 dB (according to the example cited in FIG. 2) during simultaneous functioning of the laser 30 and detector 20.

In order to minimise the impact of this non-guided stray light, the invention proposes to reduce the active portion 33 of the detector 30.

This is because it has been found that only the first micrometers of the detector 30 absorb approximately 90% of the signal to be detected. Thus, for example, only 30 μm of a 80 μm long detector are enough for good detection of a signal.

However, the non-guided stray light is distributed over the entire waveguide 31 of the detector 30. Thus the rear portion 34 of the detector 30 can collect more stray light 60 than signal.

This is why the active portion 33 able to detect a signal is reduced, the unguided stray light being distributed over the whole of the detector 30.

Advantageously, the length of the active portion of the detector is fixed so that the said portion is able to detect, for example, approximately 90% of the signal.

The stray light coupled to the waveguide 31 in the active portion 33 is buried in the noise of the detector 30, the signal being sufficiently strong to be correctly detected, whilst the stray light coupled to the waveguide 31 in the remaining portion 34 is more intense than the signal that has already almost completely been detected. Thus the remaining portion 34 of the detector 30 detects more stray light 60 than the signal and impairs the quality of the detector 30.

Several means can be envisaged for limiting the active portion 33 of the detector 30.

A first method is illustrated in FIG. 3 and consists of implanting protons in the rear portion 34 of the detector 30.

This implantation of H+ protons, carried out in accordance with conventional techniques, has the effect of making the cladding layer 11 of the rear portion 34 insulating, that is to say incapable of collecting the carriers to the absorbent layer 12 in order to be gathered on the metallic electrode 32.

The implantation of H+ protons can also make it possible to reduce the width of the active portion 33 for given applications.

A second method is illustrated in FIG. 4 and consists of locating the absorbent layer 12 and the metallic electrode 32 solely on the front active portion 33 of the detector 30.

For this purpose, the absorbent layer 12 and part of the conductive layer 11 are etched on the rear portion 34 of the detector 30. Thus only the front portion 33 is able to collect the carriers. The metallic electrode 32 will then be produced solely on the active portion 33 of the detector 30.

A third method is illustrated in FIGS. 5a to 5c and consists of making an etching of the active layer 31 of the detector 30 so as to obtain an active waveguide 31 at the front 33 of the detector 30 and a passive area 35 at the rear 34 of the detector 30.

By way of example, the diagrams in FIGS. 5a to 5c depict views in transverse section in the direction of the length of the optical component according to the invention during different steps of this etching method.

This method can consist, for example, firstly (FIG. 5a), of growing, on a substrate 10, a first layer of quaternary material 31 able to fulfil the role of active waveguide of the detector 30.

A local etching (FIG. 5b) of the waveguide 31 is then carried out, in accordance with a conventional etching method, in order to limit the active guide 31 to an active area 33. Another epitaxy step then makes it possible to grow the waveguide on the other element 21, as well as a passive area 35 on the rear 34 of the detector 30. The structure of the passive area 35 is different from that of the active guide 31.

For example, the passive area 35 can be a passive guide, or be of the same nature as the cladding layer 11, or of any other composition.

These layers 21, 31 and 35 are then buried in a cladding layer made of InP 11, which constitutes the previously described conductive layer, and an absorbent layer 12. An electrode 32 is produced on the detector 30, without necessarily being limited to the active portion 33 since no carrier will come from the rear portion 34 of the detector 30.

A fourth method is illustrated in FIGS. 6a and 6b and consists of cleaving the detector 30 in order to limit it to the active portion 33.

This FIG. 6b is a plan view of the optical component of FIG. 6a.

The detector 30 being cleaved and reduced to the active portion 33, the latter is too narrow to receive a metallic electrode 32, whose dimensions are determined by the production of a hard-wired connection. The latter is generally achieved by thermocompression of a gold wire on the metallic electrode 32, this welding being difficult to carry out on an electrode with a size of 30 μm.

It is consequently necessary to effect a transfer of metallisation for the metallic electrode 32, that is to say to produce this electrode 32 on the central section 40 and to establish the contact with the active portion 33 of the detector 30 by means of a conductive bridge 36.

What is claimed is:

1. A method of manufacturing a semiconductor optoelectronic component comprising at least two optically active structures (20, 30), at least one of which consists of a detector (30), characterised in that it comprises a step of limiting the length of the active portion (33) of the detector or detectors able to detect a signal at a given wavelength, the non-guided stray light conveyed in the component being distributed over the entire detector or detectors (30).

2. A method according to claim 1, characterised in that the limitation of the active portion (33) of the detector or detectors (30) is achieved by implanting protons on the remaining portion (34) of the detector (30).

3. A method according to claim 1, characterised in that the limitation of the active portion (33) of the detector or detectors (30) is achieved by locating the contact (13) of the detector (30) on this portion (33).

4. A method according to claim 1, characterised in that the limitation of the active portion (33) of the detector or detectors (30) is achieved by etching the remaining portion (34) and growing a passive layer (35) on the latter (34).

5. A method according to claim 1, characterised in that the detector (30) is cleaved so as to limit it to its active portion (33).

6. A semiconductor opto-electronic component comprising at least two optically active structures (20, 30), at least one of which comprises a detector (30), the said active structures (20, 30) being separated by an intermediate section (40), characterised in that the detector or detectors (30) comprise a first active portion (33) able to detect a signal at a given wavelength and a second inactive portion (34) only slightly sensitive to the signal to be detected and exposed to the non-guided stray light conveyed in the component.

7. A component according to claim 6, characterised in that the second portion (34) of the detector or detectors (30) is implanted with protons.

8. A component according to claim 6, characterised in that the contact (13) on the detector (30) is located on the first portion (33).

9. A component according to claim 6, characterised in that each portion (33, 34) has different epitaxial layers (4), the first portion (33) comprising an active layer (31) and the second portion (34) comprising a passive area (35).

10. A semiconductor opto-electronic component comprising at least two optically active structures (20, 30), at least one of which consists of a detector (30), the said active structures (20, 30) being separated by an intermediate section (40), characterised in that the detector (30) is cleaved so as to limit it to the length of the active portion (33) able to detect a signal at a given wavelength.

11. A component according to claim 6 characterised in that the reception wavelength of the detector (30) is greater than the operating wavelength or wavelengths of the other optically active structure or structures (20).

12. A component according to any one of claim 6 characterised in that it constitutes an in-line transceiver.

13. A component according to any one of claim 6 characterised in that it constitutes an array of receivers.

* * * * *